United States Patent
Yang (10) Patent No.: US 8,164,905 B2
(45) Date of Patent: Apr. 24, 2012

(54) HEAT SINK ASSEMBLY

(75) Inventor: Jian Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/915,009

(22) Filed: Oct. 29, 2010

(65) Prior Publication Data

US 2011/0149520 A1    Jun. 23, 2011

(30) Foreign Application Priority Data

Dec. 21, 2009   (CN) .......................... 2009 1 0311921

(51) Int. Cl.
*H05K 7/20*  (2006.01)
*F28F 7/00*  (2006.01)
*H01L 23/34*  (2006.01)

(52) U.S. Cl. ....... 361/719; 165/80.2; 165/185; 257/719; 361/704

(58) Field of Classification Search .................. None
See application file for complete search history.

(56) References Cited

U.S. PATENT DOCUMENTS

| | | | |
|---|---|---|---|
| 6,510,054 B1 * | 1/2003 | Chen | 361/704 |
| 6,518,507 B1 * | 2/2003 | Chen | 174/252 |
| 7,167,369 B1 * | 1/2007 | Huynh et al. | 361/719 |
| 7,203,066 B2 * | 4/2007 | Lee et al. | 361/704 |
| 7,672,136 B2 * | 3/2010 | He et al. | 361/719 |
| 7,697,297 B2 * | 4/2010 | Chen et al. | 361/719 |
| 2003/0062195 A1 * | 4/2003 | Arrigotti et al. | 174/260 |
| 2003/0227749 A1 * | 12/2003 | Li | 361/697 |
| 2005/0094377 A1 * | 5/2005 | Lee et al. | 361/704 |
| 2005/0174739 A1 * | 8/2005 | Chen et al. | 361/704 |

* cited by examiner

*Primary Examiner* — Gregory Thompson
(74) *Attorney, Agent, or Firm* — Altis Law Group, Inc.

(57) ABSTRACT

An exemplary heat sink assembly includes a heat sink and a clip resiliently clamping the heat sink on a printed circuit board. The heat sink includes a base and a plurality of first fins and two central second fins extending upwardly from the base. The clip includes a locating portion fixed between the second fins of the heat sink, a pair of elastic portions extending outwardly from opposite ends of the locating portion and oriented towards substantially opposite directions, and two hooks extending outwardly from ends of the operating members, respectively. An acute included angle is formed between each elastic portion and the locating portion of the clip in an original relaxed position, and the acute included angles become approximately right angles when the clip is preassembled in the heat sink with the elastic portions abutting the second fins.

10 Claims, 8 Drawing Sheets

HEAT SINK ASSEMBLY

BACKGROUND

1. Technical Field

The present disclosure relates to heat dissipation, and more particularly to a heat sink assembly including a wire clip.

2. Description of Related Art

Heat produced during operation of electronic components such as central processing units (CPUs) must be quickly removed to allow the electronic components to function normally. Often, a heat sink is disposed on an electronic component mounted on a printed circuit board to dissipate heat therefrom.

Figure 1:
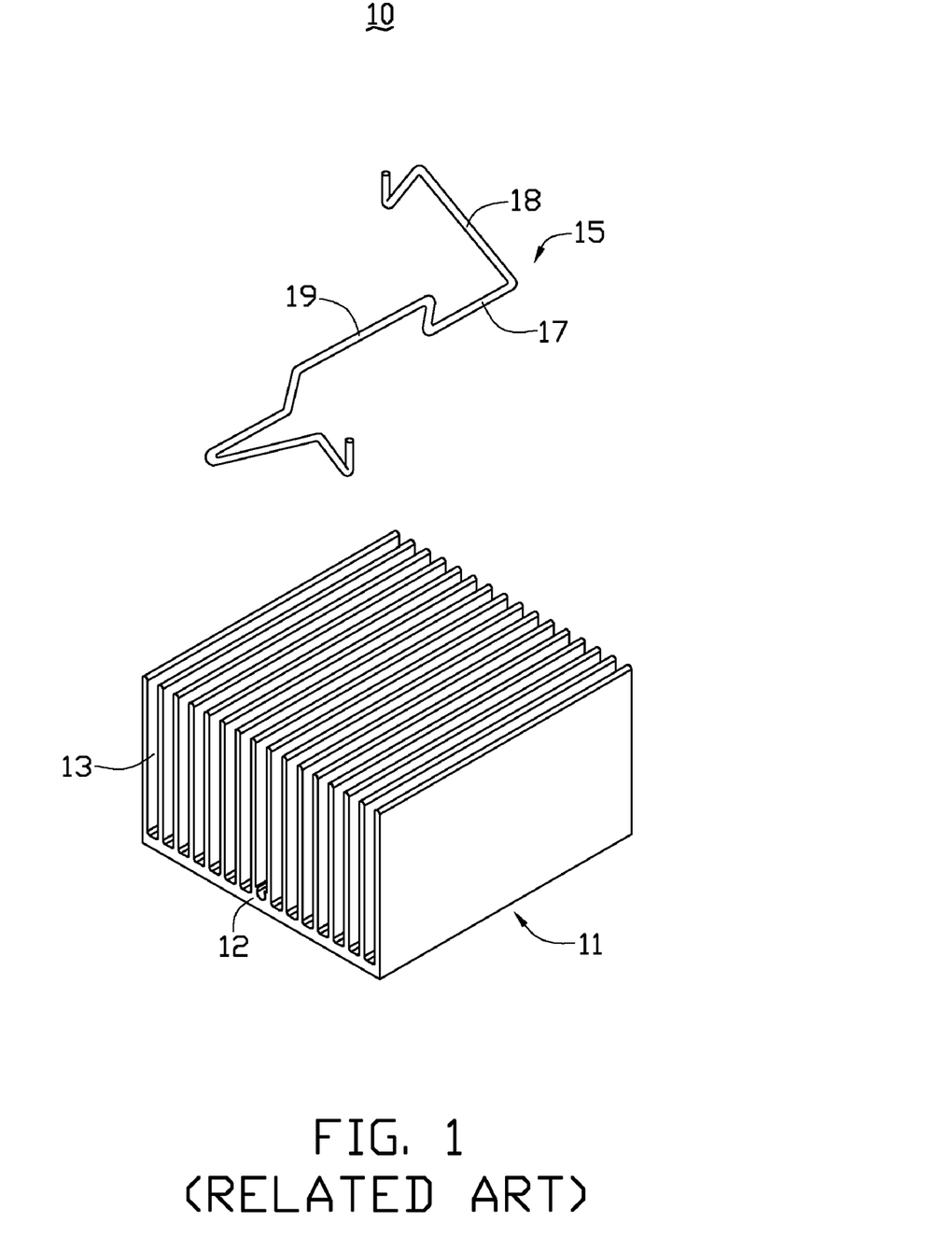
FIG. 1 is an exploded view of a related art heat sink assembly.

Wire clips are frequently used to secure heat sinks onto printed circuit boards. Referring to FIG. 1, a commonly used heat sink assembly 10 includes a heat sink 11 and a wire clip 15. The heat sink 11 includes a base 12, and a plurality of fins 13 extending from the base 12. The wire clip 15 includes a central contact portion 17 defining a major axis, and a pair of elastic portions 18 extending from opposite ends of the contact portion 17. As viewed from a side of the wire clip 15 along a direction of the major axis (FIG. 2), one of the elastic portions 18 extends generally toward a left of the contact portion 17, and the other elastic portion 18 extends generally toward a right of the contact portion 17. Thus the two elastic portions 18 together with the contact portion 17 define a substantially V-shaped device. The contact portion 17 is received between two adjacent central fins 13 of the heat sink 11, and the elastic portions 18 hook the printed circuit board. The contact portion 17 includes a central protruding section 19, which is offset from and parallel to other sections of the contact portion 17. The protruding section 19 limits rotation of the contact portion 17 relative to the heat sink 11.

Figure 2:
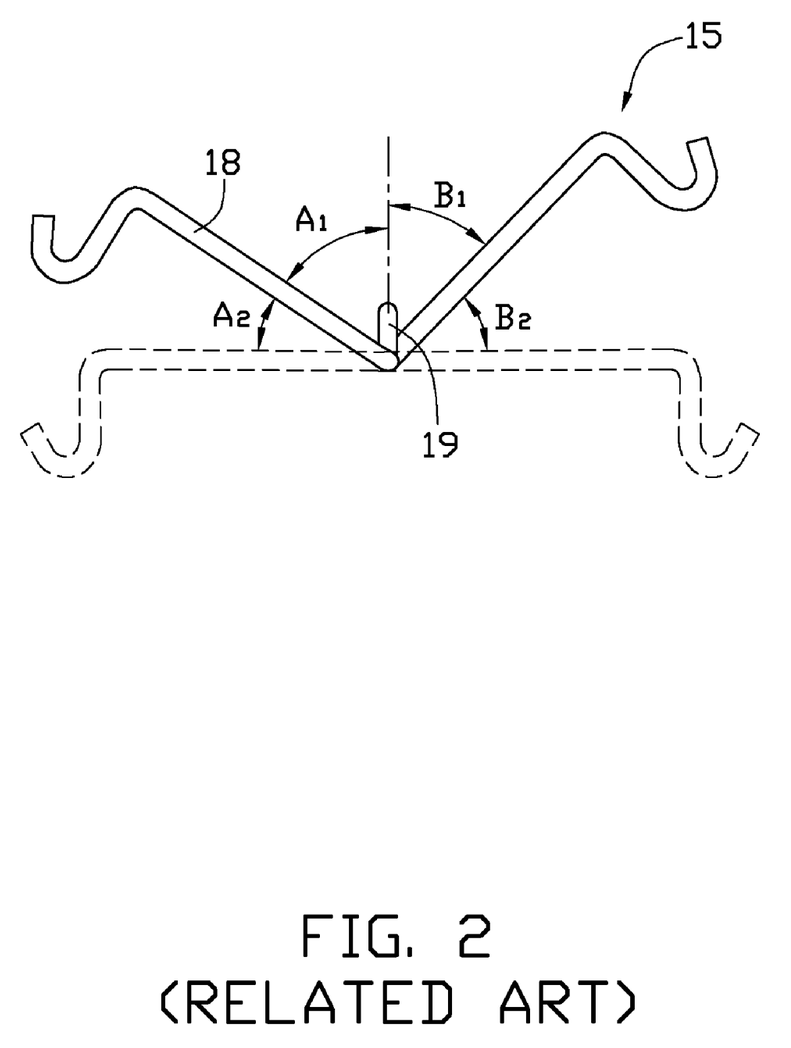
FIG. 2 is a side plan view of a clip of the heat sink assembly of FIG. 1, showing the clip in an original relaxed position (solid lines) and in a locked position (phantom lines).
Figure 3:
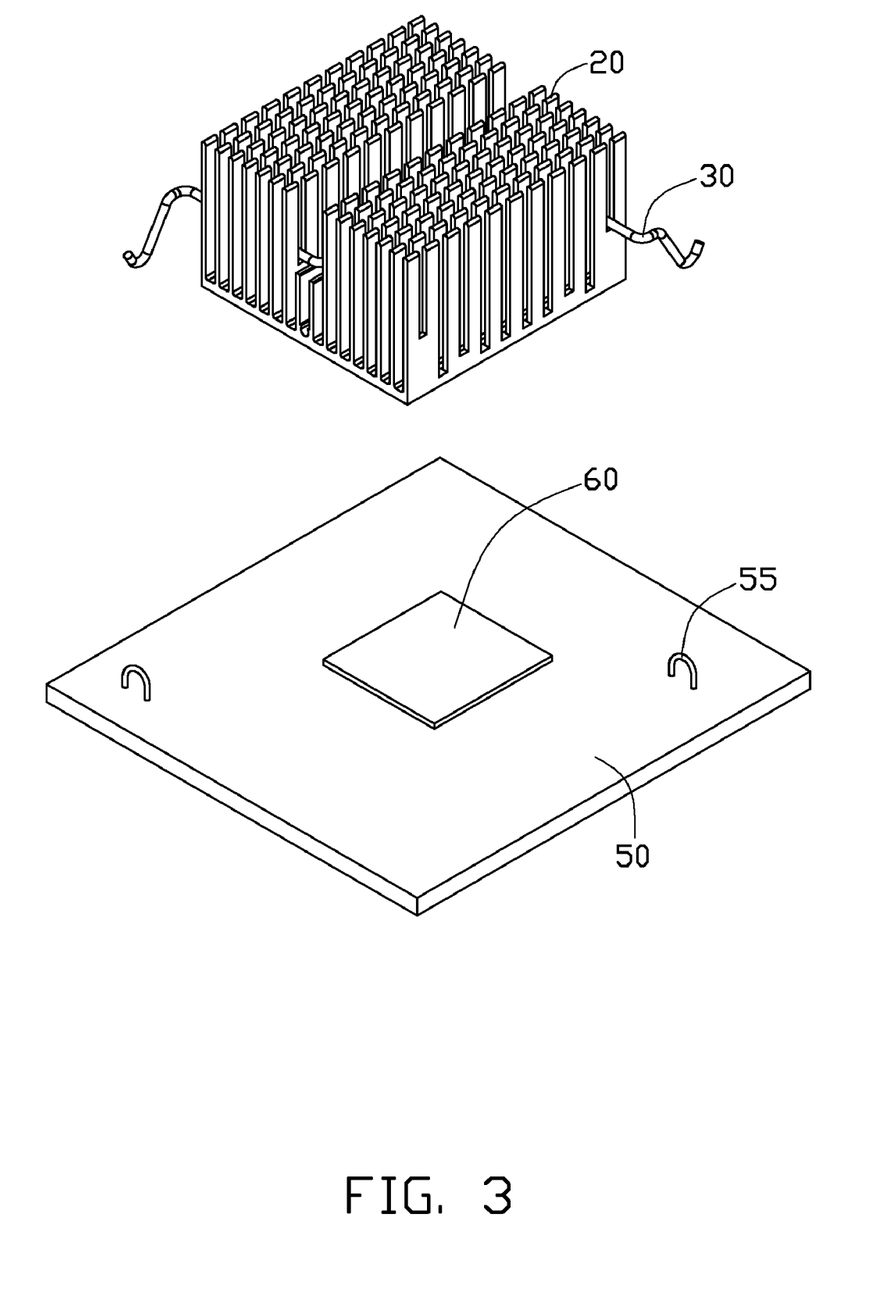
FIG. 3 is an assembled view of a heat sink assembly according to a first embodiment of the present disclosure, showing the heat sink assembly ready to be mounted on a printed circuit board.
Figure 4:
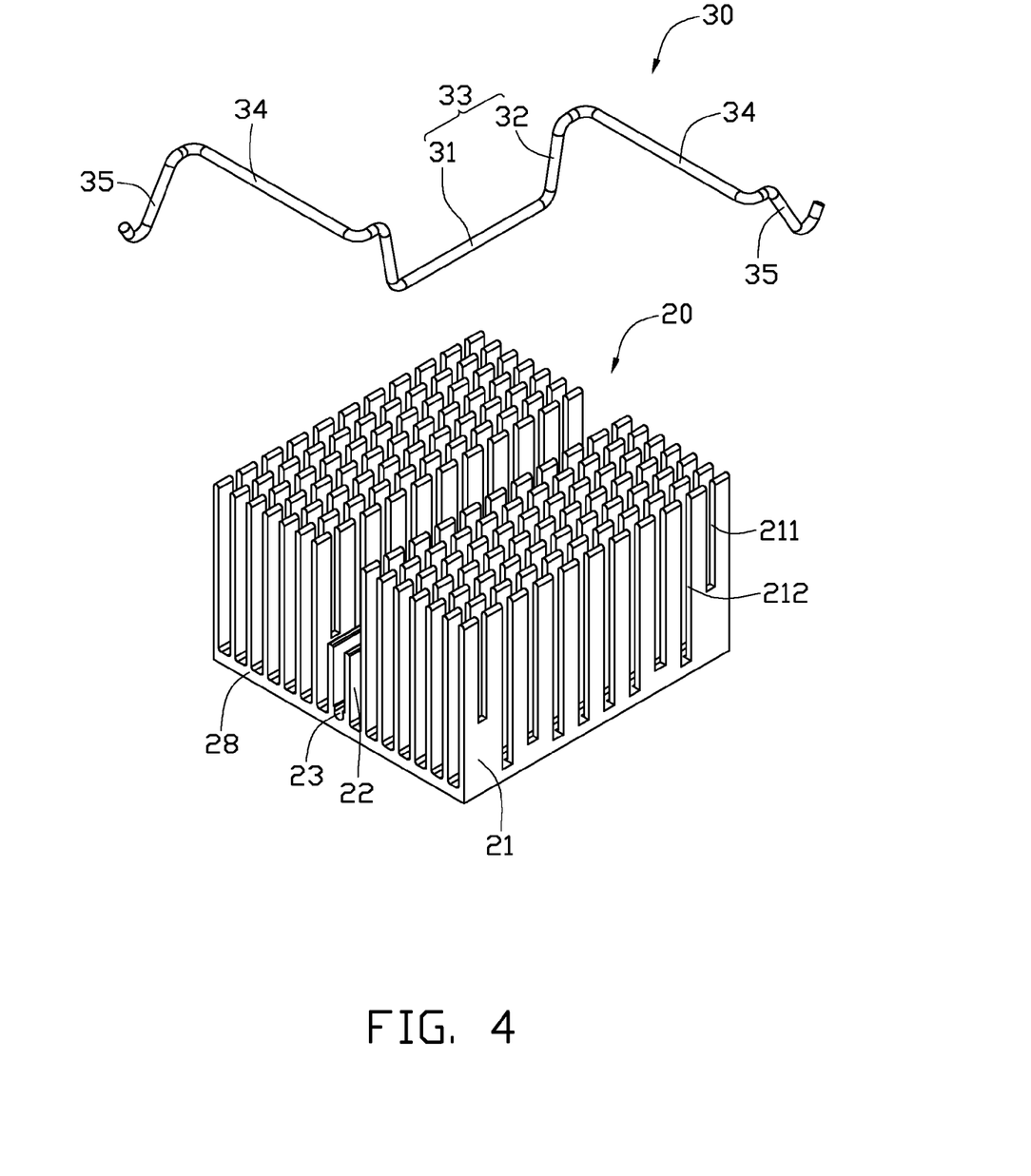
FIG. 4 is an exploded view of the heat sink assembly of FIG. 3.
Figure 5:
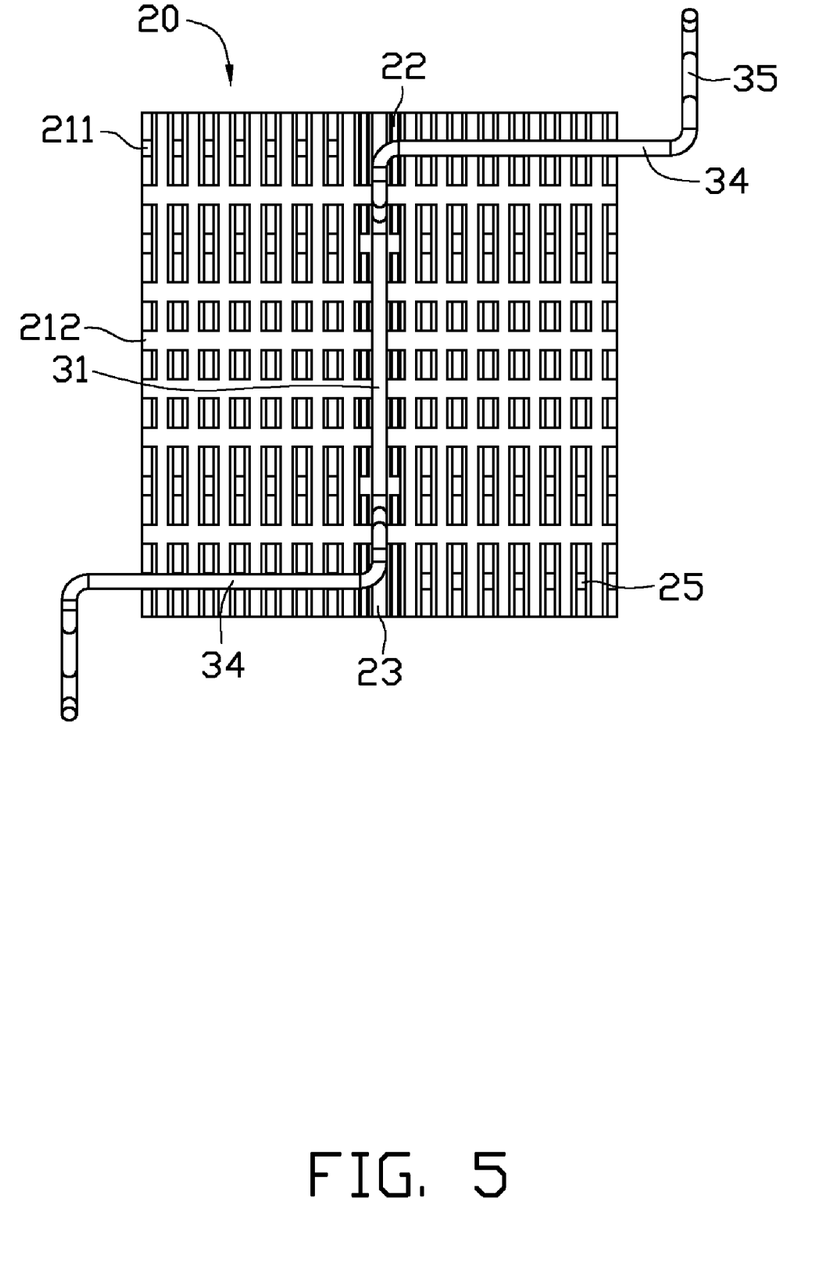
FIG. 5 is a top plan view of the heat sink assembly of FIG. 3.
Figure 6:
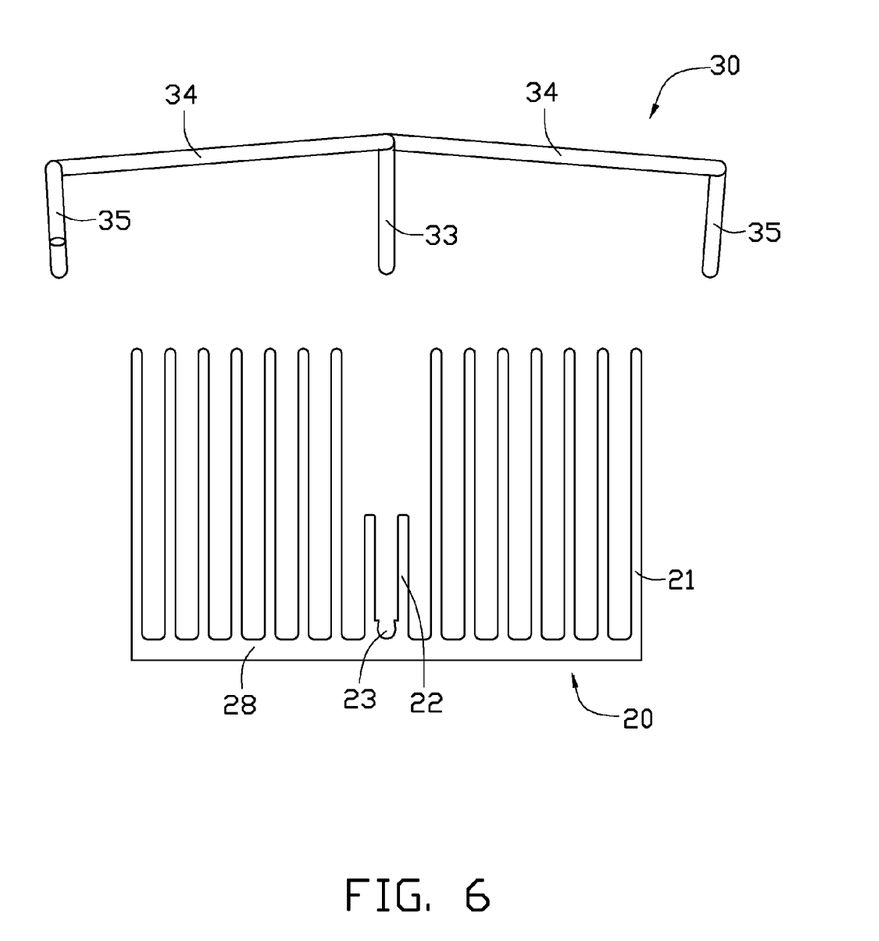
FIG. 6 is a front plan view of the heat sink assembly of FIG. 4, but showing a clip of the heat sink assembly in an original relaxed position.

Referring to FIG. 2, since the contact portion 17 with the protruding section 19 is blocked and held in position in the heat sink 11, values of hooking forces of the elastic portions 18 are proportional to angles defined between the elastic portions 18 and the protruding section 19. However, due to ordinary manufacturing imprecision (i.e., tolerances), when the wire clip 15 is in an original relaxed position, an angle A1 between one elastic portion 18 and the protruding section 19 may differ from an angle B1 between the other elastic portion 18 and the protruding section 19. Thus when the elastic portions 18 are moved to horizontal positions and are hooked to the printed circuit board in locked positions, a variable angle A2 between said one elastic portion 18 at the original relaxed position and said one elastic portion 18 at the locked position is liable to be different from a variable angle B2 between the other elastic portion 18 at the original relaxed position and the other elastic portion 18 at the locked position. When this happens, the values of the hooking forces of the elastic portions 18 are imbalanced, and the heat sink 11 is liable to be unstably mounted.

What is needed, therefore, is a heat sink assembly having a heat sink and a clip, wherein the clip can firmly and evenly secure the heat sink to a printed circuit board.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views, and all the views are schematic.

DETAILED DESCRIPTION

Referring to FIGS. 3 to 6, a heat sink assembly (not labeled) is for dissipating heat generated by an electronic component 60 mounted on a printed circuit board 50. The heat sink assembly comprises a heat sink 20, and a wire clip 30 securing the heat sink 20 on the printed circuit board 50. The printed circuit board 50 forms a pair of shackles 55 located near diagonally opposite corners of the heat sink 20. Each of the shackles 55 defines an opening to receive the clip 30.

The heat sink 20, typically made of copper or aluminum, comprises a rectangular base 28, and a plurality of first fins 21 and two second fins 22 extending upwardly from a top surface of the base 28. The second fins 22 are formed at the center of the base 28, and are sandwiched between two groups of the first fins 21. The first fins 21 and the second fins 22 are all spaced from and parallel to each other, defining a plurality of parallel lengthwise channels in the heat sink 20. Each of the first fins 21 defines two upright first slits 211 at two opposite outmost portions thereof, respectively. Each of the first slits 211 is defined from a top edge of the first fin 21 down. A length (height) of the first slit 211 is approximately half that of the first fin 21, and a bottom end of the first slit 211 is lower than top edges of the second fins 22. Each of the first and second fins 21, 22 defines a number of second slits 212 parallel to the first slits 211, thereby defining a plurality of parallel transverse channels in the heat sink 20. The first slits 211 and the second slits 212 are all parallel to each other. The first slits 211 of the first fins 21 cooperatively define two mounting passages 25 at opposite sides of the heat sink 20. A slot 23 is defined between bottom ends of the second fins 22, to securely receive the clip 30 therein. The tops of the second fins 22 are lower than the tops of the first fins 21, and higher than the bottoms of the first slits 211.

The clip 30, made of a single spring wire, comprises an elongated locating portion 33, two elastic portions 34 respectively extending outwards from top ends of the locating portion 33 and oriented towards opposite directions, and two hooks 35 extending outwardly from ends of the elastic portions 34, respectively. The elastic portions 34 have the same length. The locating portion 33 has a generally U-shaped configuration, and comprises a straight contact section 31 and a pair of connecting sections 32 extending upwards from opposite ends of the contact section 31. The contact section 31 and the connecting sections 32 share a same vertical plane. When the clip 30 is in an original relaxed position, each of the elastic portions 34 extends slightly downwards from the locating portion 33 (see FIG. 6). Thus, an acute included angle (not labeled) is defined between each elastic portion 34 and the locating portion 33. The acute included angle between one elastic portion 34 and the locating portion 33 may be different from the acute included angle between the other elastic portion 34 and the locating portion 33, due to ordinary manufacturing imprecision.

Figure 7:
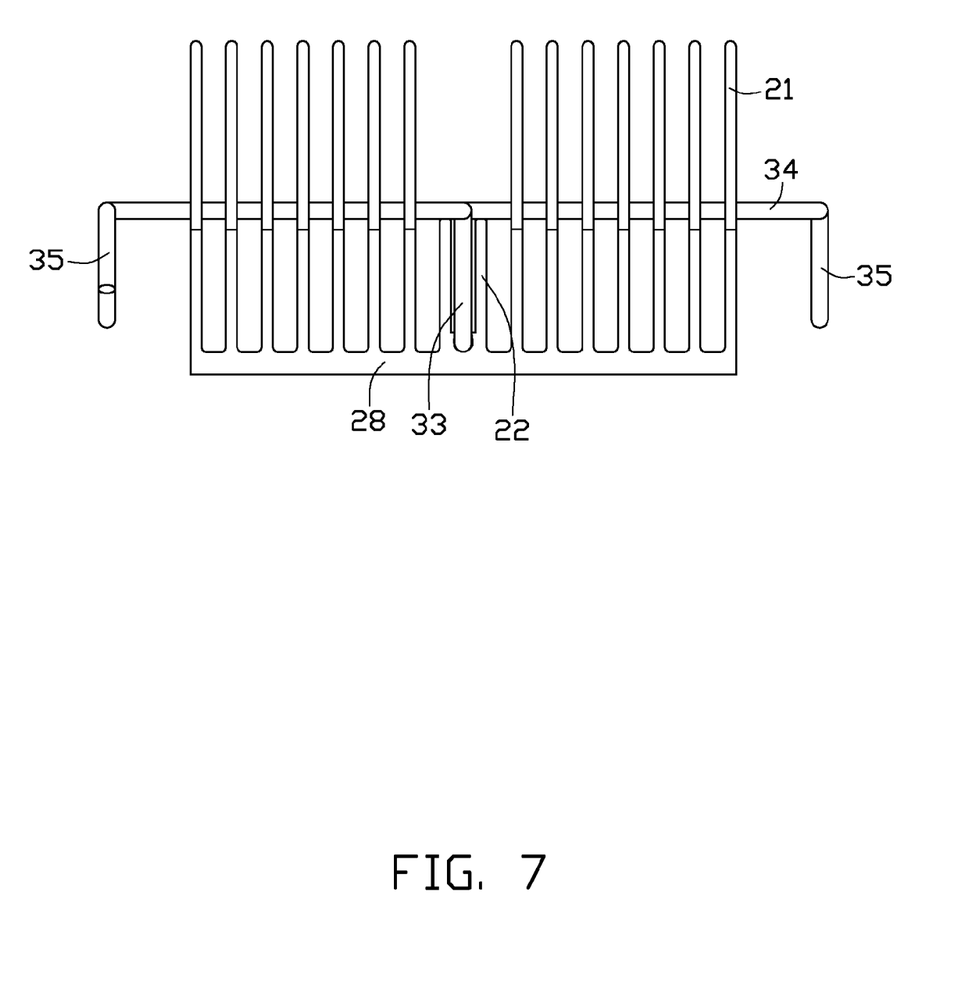
FIG. 7 is a front plan view of the heat sink assembly of FIG. 3.
Figure 8:
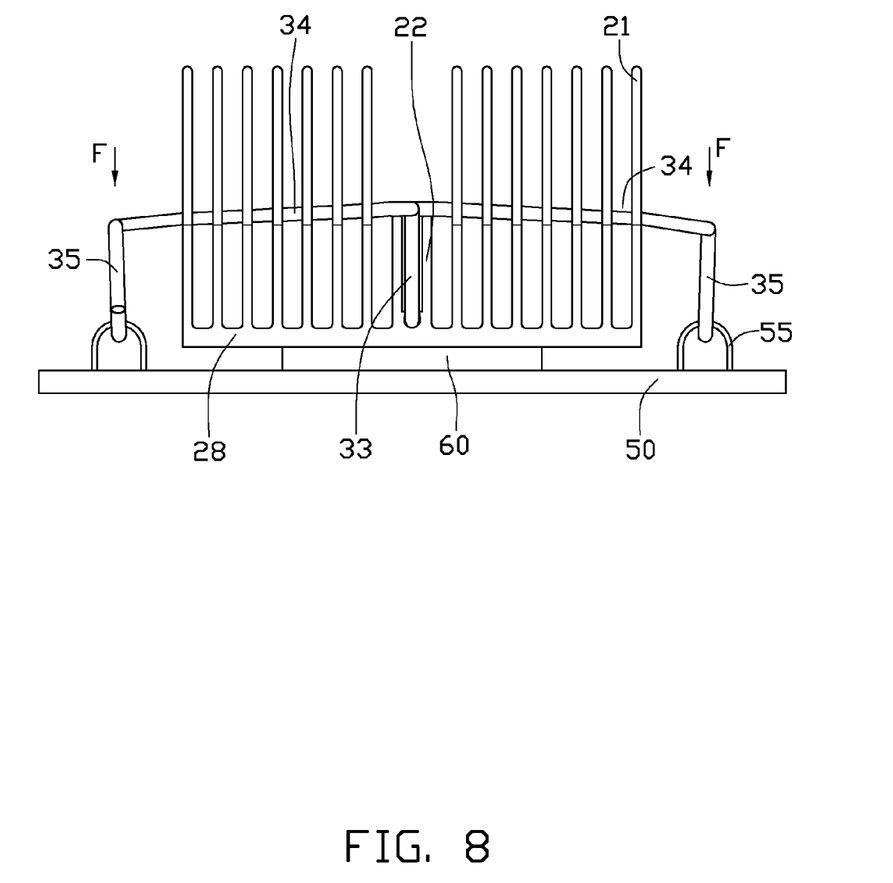
FIG. 8 is similar to FIG. 7, but showing the clip of the heat sink assembly engaged with the printed circuit board of FIG. 3 and thereby mounting the heat sink assembly on the printed circuit board.

Referring also to FIG. 7, in assembly of the heat sink 20 and the clip 30, the contact section 31 of the clip 30 is received in the slot 23 of the heat sink 20 from the top down. The contact section 31 is fixed in the slot 23 by interference fit in a position such that the contact section 31 is snugly at the bottom of the slot 23 (e.g. as seen in FIGS. 7-8). The connecting sections 32 are sandwiched between the second fins 22. Thereby, rotation of the connecting sections 32 is limited by the second fins 22. The elastic portions 34 are received in corresponding of the first slits 211 of the heat sink 20, with inmost ends of the elastic portions 34 abutting the tops of the second fins 22, respectively. Thus the elastic portions 34 are raised by the second fins 22 and become oriented perpendicular to the connecting sections 32. The acute included angles between the elastic portions 34 and the locating portion 33 become substantially right angles. Thus, any difference between the two acute included angles defined between the elastic portions 34 and the locating portion 33 is eliminated. In other words, any manufacturing imprecision of the clip 30 is obviated by an adjustment of the orientations of the elastic portions 34 by the second fins 22. In this state, the elastic portions 34 span the tops of the second fins 22, respectively, and are located above and spaced a distance from the bottom ends of the first fins 21 in the first slits 211.

Referring to FIG. 8, the heat sink 20 with the clip 30 attached thereon is disposed on the printed circuit board 50 to contact the electronic component 60 on the printed circuit board 50. The hooks 35 of the clip 30 are pressed downwards and enter the openings of the shackles 55. In the process, each of the elastic portions 34 bends downwards, such that outer ends of the elastic portions 34 abut the bottom ends of the first slits 211 of the two outmost first fins 21, respectively. An outmost portion of the outer end of each elastic portion 34 continues to bend downwards, such that the outer ends of the elastic portions 34 press the bottom ends of the first slits 211 of the two outmost first fins 21, respectively. Finally, the pressing on the elastic portions 34 is released, the outmost portions of the outer ends of the elastic portions 34 rebound slightly, and the hooks 35 elevate and engage the shackles 55. The heat sink 20 is thus securely mounted on the printed circuit board 10.

In the assembly process, the second fins 22 support and adjust the elastic portions 34 so that the elastic portions 34 are oriented perpendicular to the locating portion 33. Therefore when the elastic portions 34 are subsequently pressed and bend, they experience substantially the same elastic variation in shape, and generate substantially the same elastic potential energy. Accordingly, when the hooks 35 are engaged with the shackles 55, the elastic forces exerted by the elastic portions 34 are substantially the same. Thus, the heat sink 30 is securely and evenly mounted on the printed circuit board 10 by the clip 30. Furthermore, in the assembled position, the elastic portions 34 are supported by both the second fins 22 and the outermost first fins 21. That is, each elastic portion 34 is deformed twice at two points on the heat sink 30, respectively. The multiple contact points of the elastic portions 34 at different positions of the heat sink 30 help ensure that the heat sink 30 is stably held on the electronic component 60.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink assembly comprising:
   a heat sink configured to be located on an electronic component on a printed circuit board, the heat sink comprising:
      a base; and
      a plurality of first fins and two second fins extending upwardly from the base, the second fins sandwiched between two groups of the first fins; and
   a clip for resiliently clamping the heat sink on the electronic component on the printed circuit board, the clip comprising a locating portion fixed between the second fins of the heat sink, a pair of elastic portions extending outwardly from opposite ends of the locating portion and oriented towards substantially opposite directions, and two hooks extending outwardly from ends of the elastic portions, respectively;
   wherein an acute included angle is formed between each elastic portion and the locating portion of the clip when the clip is in an original relaxed position, and the acute included angles become approximately right angles when the clip is preassembled in the heat sink with the elastic portions abutting the second fins.

2. The heat sink assembly of claim 1, wherein tops of the second fins are lower than tops of the first fins, and each of the first fins defines a pair of vertical slits near opposite ends thereof.

3. The heat sink assembly of claim 2, wherein bottom ends of the slits are lower than the tops of the second fins, one of the elastic portions of the clip is located in the slits of corresponding first fins at one side of the heat sink, and the other elastic portion of the clip is located in the slits of corresponding first fins at an opposite side of the heat sink.

4. The heat sink assembly of claim 1, wherein the elastic portions are the same length.

5. The heat sink assembly of claim 1, wherein the locating portion comprises a straight contact section and a pair of connecting sections extending upwards from opposite ends of the contact section.

6. The heat sink assembly of claim 5, wherein a slot is defined between bottom ends of the second fins in which the contact section is fixed by interference fit.

7. The heat sink assembly of claim 5, wherein the connecting sections are sandwiched between the second fins such that rotation of the connecting sections is limited by the second fins.

8. A heat sink assembly comprising:
   a heat sink comprising two central plates, the heat sink defining:
      a slot between bottom ends of the central plates; and
      two mounting passages at opposite sides thereof; and
   a clip for resiliently clamping the heat sink on a circuit board, the clip comprising a contact section fixed in the slot, a pair of connecting sections extending upwards from opposite ends of the contact section, a pair of elastic portions extending outwardly from ends of the connecting sections and oriented towards substantially opposite directions, and a pair of hooks extending outwardly from ends of the elastic portions;

wherein an acute included angle is formed between each elastic portion and each connecting section of the clip when the clip is in an original relaxed position, and the acute included angles become approximately right angles when the clip is assembled in the heat sink with the elastic portions abutting tops of the central plates.

9. The heat sink assembly of claim 8, wherein bottom ends of the mounting passages are lower than the tops of the central plates.

10. The heat sink assembly of claim 8, wherein the elastic portions have the same length.

* * * * *